(12) United States Patent
Denta et al.

(10) Patent No.: US 11,177,224 B2
(45) Date of Patent: Nov. 16, 2021

(54) METHOD OF MANUFACTURING SEMICONDUCTOR DEVICE

(71) Applicant: FUJI ELECTRIC CO., LTD., Kawasaki (JP)

(72) Inventors: Toshio Denta, Matsumoto (JP); Yuji Ichimura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/836,808

(22) Filed: Mar. 31, 2020

(65) Prior Publication Data

US 2020/0357753 A1  Nov. 12, 2020

(30) Foreign Application Priority Data

May 9, 2019 (JP) .............................. JP2019-088834

(51) Int. Cl.
*H01L 23/00* (2006.01)
*H01L 25/07* (2006.01)
(Continued)

(52) U.S. Cl.
CPC ........ *H01L 23/564* (2013.01); *H01L 21/4817* (2013.01); *H01L 23/057* (2013.01); *H01L 24/48* (2013.01); *H01L 24/85* (2013.01); *H01L 25/072* (2013.01); *H01L 25/18* (2013.01); *H01L 25/50* (2013.01); *H01L 2224/48139* (2013.01);
(Continued)

(58) Field of Classification Search
CPC . H01L 23/564; H01L 23/057; H01L 21/4817; H01L 24/48; H01L 24/85; H01L 25/072; H01L 25/18; H01L 25/50; H01L 2224/48139; H01L 2224/85205;
(Continued)

(56) References Cited

U.S. PATENT DOCUMENTS 4,716,184 A * 12/1987 Kagawa .................... C08K 3/28
                                                         523/310
8,212,279 B2 * 7/2012 Lin ....................... H01L 33/486
                                                          257/99
(Continued)

FOREIGN PATENT DOCUMENTS

JP    2002033558 A    1/2002
JP    2003124400 A    4/2003
(Continued)

*Primary Examiner* — Tu-Tu V Ho
(74) *Attorney, Agent, or Firm* — Rabin & Berdo, P.C.

(57) ABSTRACT

A flat plate frame is formed, which is flat plate-shaped, which has an opening penetrating its front and rear surfaces and groove terminal patterns formed on its front surface, and which contains a semi-cured thermosetting resin. Then, an insulating substrate is disposed on the rear surface so as to cover the opening of the flat plate frame, external connection terminals are disposed on the terminal patterns, and heating is carried out. As a result, a terminal package to which the insulating substrate and external connection terminals are firmly joined is produced using the flat plate frame. The external connection terminals included in the terminal package are reliably and firmly joined to the terminal package. Therefore, the external connection terminals are not displaced when wires are bonded to the external connection terminals.

15 Claims, 11 Drawing Sheets

(51) Int. Cl.
  *H01L 25/18*  (2006.01)
  *H01L 23/057*  (2006.01)
  *H01L 21/48*  (2006.01)
  *H01L 25/00*  (2006.01)

(52) U.S. Cl.
  CPC ............... *H01L 2224/85205* (2013.01); *H01L 2924/12032* (2013.01); *H01L 2924/12036* (2013.01); *H01L 2924/13055* (2013.01); *H01L 2924/13091* (2013.01)

(58) Field of Classification Search
  CPC . H01L 2924/12032; H01L 2924/12036; H01L 2924/13055; H01L 2924/13091
  USPC ........................................................ 438/107
  See application file for complete search history.

(56) References Cited

U.S. PATENT DOCUMENTS

| | | | |
|---|---|---|---|
| 2002/0181211 A1 | 12/2002 | Suzumura et al. | |
| 2011/0049558 A1* | 3/2011 | Lin | H01L 33/486 |
| | | | 257/99 |
| 2014/0210060 A1 | 7/2014 | Nakamata et al. | |

FOREIGN PATENT DOCUMENTS

| | | |
|---|---|---|
| JP | 2006156721 A | 6/2006 |
| JP | 2014146704 A | 8/2014 |

* cited by examiner

METHOD OF MANUFACTURING SEMICONDUCTOR DEVICE

CROSS-REFERENCE TO RELATED APPLICATION

This application is based upon and claims the benefit of priority of the prior Japanese Patent Application No. 2019-088834, filed on May 9, 2019, the entire contents of which are incorporated herein by reference.

BACKGROUND OF THE INVENTION

1. Field of the Invention

The embodiment discussed herein relates to a method of manufacturing a semiconductor device.

2. Background of the Related Art

Semiconductor devices having semiconductor elements such as insulated gate bipolar transistors (IGBTs) and power metal oxide semiconductor field effect transistors (MOSFETs) are used as power conversion devices, for example. Such a semiconductor device is manufactured in the following manner: A terminal package with external connection terminals, such as a lead frame, is molded by insert molding using a thermoplastic resin, a circuit substrate having semiconductor chips, electronic components, and others disposed thereon is housed in the terminal package, and the terminal package is sealed with a sealing member by transfer molding.

See, for example, Japanese Laid-open Patent Publication No. 2014-146704.

However, since the thermoplastic resin that is the material of the terminal package and a metal that is the material of the external connection terminals are not chemically bonded together, the external connection terminals are not firmly joined to the terminal package molded as stated above. To deal with this, there is an attempt to obtain the anchoring effect by forming unevenness on the surfaces of the external connection terminals for the thermoplastic resin, in order to maintain the adhesion between the external connection terminals and the terminal package. However, this anchoring effect only is not sufficient to maintain the adhesion. When a wire is wire bonded to an external connection terminal in this terminal package, the external connection terminal is displaced by ultrasonic vibration, which prevents the wire from being reliably bonded to the external connection terminal. For this reason, semiconductor devices manufactured as above may decrease their reliability.

SUMMARY OF THE INVENTION

According to one aspect, there is provided a method of manufacturing a semiconductor device. The method includes: preparing a substrate and an external connection terminal; forming a first semi-cured member that contains a thermosetting resin and is in a semi-cured state, the first semi-cured member having a planar shape, including an opening penetrating from a front surface to a rear surface of the first semi-cured member, and having a groove pattern formed at the front surface thereof; and disposing the substrate on the rear surface of the first semi-cured member so as to cover the opening of the first semi-cured member, disposing the external connection terminal on the groove pattern, and producing a package including a first flat plate frame to which the substrate and the external connection terminal are bonded, using the first semi-cured member.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, a preferred embodiment will be described with reference to the accompanying drawings. In the following description, the terms "front surface" and "upper surface" represent surfaces facing up in a semiconductor device 10 of FIG. 2. Similarly, the term "up" represents an upward direction in the semiconductor device 10 of FIG. 2. The terms "rear surface" and "lower surface" represent surfaces facing down in the semiconductor device of FIG. 2. The term "down" represents a downward direction in the semiconductor device 10 of FIG. 2. The same directionality applies to the other drawings, as appropriate. The terms "front surface," "upper surface," "up," "rear surface," "lower surface," "down," and "side surface" are used for convenience to describe relative positional relationships, and do not limit the technical ideas of the embodiment. For example, the terms "up" and "down" do not always represent the vertical direction to the ground. That is, the "up" and "down" directions are not limited to the gravity direction.

Figure 1:
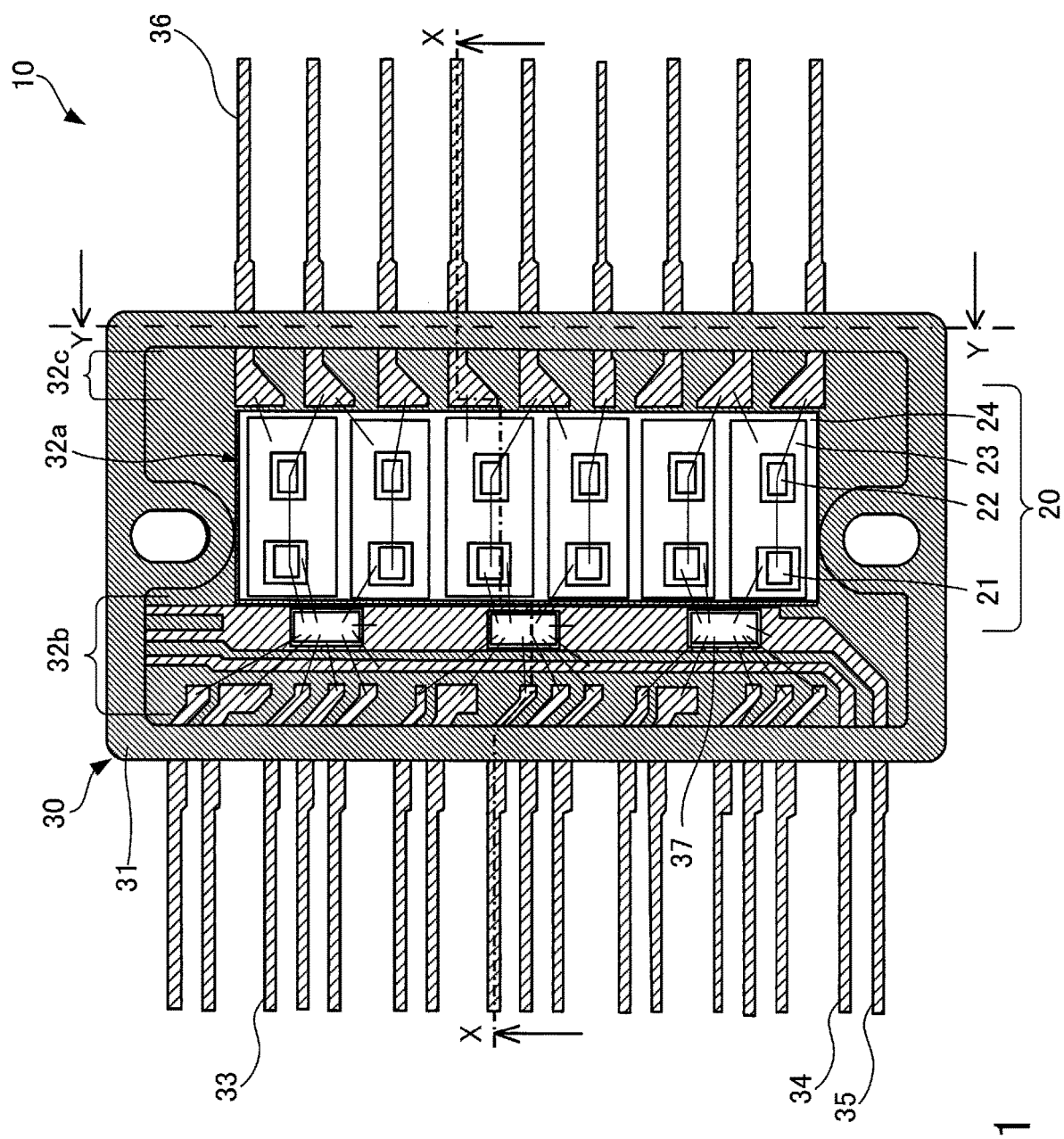
FIG. 1 is a plan view of a semiconductor device according to one embodiment.
Figure 2:
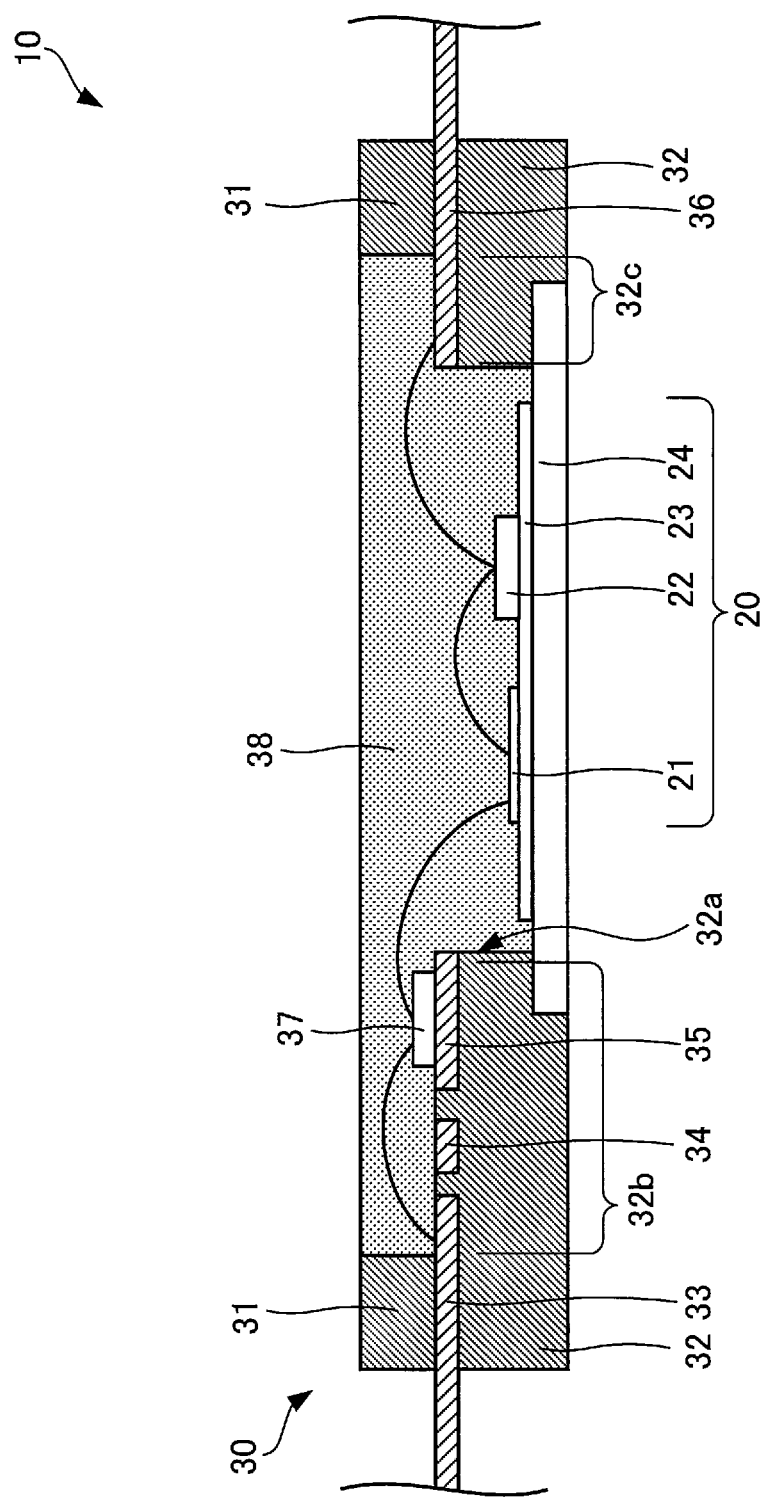
FIG. 2 is a cross-sectional view of the semiconductor device according to the embodiment.

A semiconductor device of one embodiment will be described with reference to FIGS. 1 and 2. FIG. 1 is a plan view of a semiconductor device according to the embodiment. FIG. 2 is a cross-sectional view of the semiconductor device according to the embodiment. Note that FIG. 1 does not illustrate a sealing member. FIG. 2 is a cross-sectional view taken along the dot-dashed line X-X of FIG. 1.

As illustrated in FIGS. 1 and 2, the semiconductor device 10 includes a single semiconductor unit 20, control integrated circuits (ICs) 37, and a single terminal package 30 that houses the single semiconductor unit 20 and control ICs 37 and has external connection terminals 33 to 36. The semiconductor unit 20 includes six pairs each of first and second semiconductor chips 21 and 22. In addition, the semiconductor unit 20 includes six circuit patterns 23 and an insulating substrate 24. One pair of first and second semiconductor chips 21 and 22 is disposed on the front surface of each circuit pattern 23, and the circuit patterns 23 are formed on the front surface of the insulating substrate 24. For example, in this semiconductor unit 20, the six circuit patterns 23, which each have one pair of first and second semiconductor chips 21 and 22 disposed on its front surface, are arrayed in parallel with the long sides of the insulating substrate 24 on the insulating substrate 24. Three control ICs 37 in total are provided, each for every two pairs of first and second semiconductor chips 21 and 22. Note that, with respect to a plurality of identical components in this embodiment, one of them may be described, unless otherwise noted, with the understanding that the description applies to the other components.

A first semiconductor chip 21 includes a switching element such as an IGBT or a power MOSFET, for example. In the case where the first semiconductor chip 21 includes an IGBT, the first semiconductor chip 21 has a collector electrode as a main electrode on its rear surface and a gate electrode and an emitter electrode as a main electrode on its front surface. In the case where the first semiconductor chip 21 includes a power MOSFET, the first semiconductor chip 21 has a drain electrode as a main electrode on its rear surface and a gate electrode and a source electrode as a main electrode on its front surface. The rear surface of the first semiconductor chip 21 is bonded to a circuit pattern 23 with a solder (not illustrated).

A second semiconductor chip 22 includes a diode such as a Schottky barrier diode (SBD) or a freewheeling diode (FWD), for example. Such a second semiconductor chip has an output electrode (cathode electrode) as a main electrode on its rear surface and an input electrode (anode electrode) as a main electrode on its front surface. The rear surface of the second semiconductor chip 22 is bonded to a circuit pattern 23 with a solder (not illustrated).

A circuit pattern 23 is made of a metal with high electrical conductivity, such as copper or a copper alloy. In this connection, the shape of the circuit pattern 23 in FIGS. 1 and 2 is merely an example. The circuit pattern 23 is formed by etching an electrically conductive plate or foil formed on one surface of the insulating substrate 24 or by bonding an electrically conductive plate to the one surface of the insulating substrate 24. The thickness of the circuit pattern 23 preferably ranges between 0.10 mm and 1.00 mm, inclusive, and more preferably between 0.20 mm and 0.50 mm, inclusive.

The insulating substrate 24 may be an organic insulating layer made of a composite of an insulating resin with low thermal resistance, such as an epoxy resin or a liquid crystal polymer, and a material with high thermal conductivity, such as boron nitride, aluminum oxide, or silicon oxide. Alternatively, the insulating substrate 24 may be an inorganic insulating layer made of ceramics with high thermal conductivity, such as aluminum oxide, aluminum nitride, or silicon nitride that has excellent thermal conductivity.

On the rear surface of the insulating substrate 24 of the semiconductor unit 20, a heat dissipation plate (not illustrated) may be disposed. The heat dissipation plate is made of a material with high thermal conductivity, such as aluminum, iron, silver, copper, or an alloy containing at least one of these. In addition, to improve corrosion resistance, for example, the surface of the heat dissipation plate may be plated with a material such as nickel. Specific examples of the material include, other than nickel, a nickel-phosphorus alloy, a nickel-boron alloy, and others. In this connection, a cooling unit (not illustrated) may be attached to the rear surface of the heat dissipation plate using a solder, a silver solder, or the like, to improve the heat dissipation property. The cooling unit in this case may be made of, for example, a material with high thermal conductivity, such as aluminum, iron, silver, copper, or an alloy containing at least one of these. As the cooling unit, a fin, a heat sink with a plurality of fins, or a cooling device employing water cooling may be used. The heat dissipation plate may be formed integrally with such a cooling unit. In this case, the heat dissipation plate may be made of a material with high thermal conductivity, such as aluminum, iron, silver, copper, or an alloy containing at least one of these. In addition, in order to improve corrosion resistance, for example, the surface of the heat dissipation plate formed integrally with the cooling unit may be plated with a material such as nickel. Specific examples of the material include, other than nickel, a nickel-phosphorus alloy, a nickel-boron alloy, and others. In the case of using the heat dissipation plate, a direct copper bond (DCB) substrate or active metal brazed (AMB) substrate, which is produced by bonding a copper foil to both surfaces of an inorganic insulating layer, such as aluminum oxide, aluminum nitride, or silicon nitride, may be used as a set of the circuit patterns 23, insulating substrate 24, and heat dissipation plate. In this connection, in the semiconductor unit 20 configured as above, the shapes, locations and quantity of the circuit patterns 23 and the locations and quantity of the first semiconductor chips 21 and second semiconductor chips 22 are illustrated by way of example. These are not limited to those illustrated in FIGS. 1 and 2 and are determined according to desired design requirements.

The three control ICs 37 are respectively bonded at three points to the external connection terminal 35, to be described later, with a solder (not illustrated). In this connection, in place of the control ICs 37, for example, desired electronic components, such as thermistors, capacitors, resistors, may be usable to implement desired functions.

The terminal package 30 will now be described. The terminal package 30 has an upper frame part 31 (second flat plate frame) that is a frame housing, a lower body part 32 (first flat plate frame) integrally formed with the upper frame part 31, and the external connection terminals 33 to 36 provided at the lower body part 32. The lower body part 32 is rectangular flat plate-shaped in a plan view and has a housing opening 32a that is formed at the bottom of the terminal package 30 such as to penetrate the front and rear surfaces of the terminal package 30 and to which the semiconductor unit 20 is to be attached. Further, the lower body part 32 has a first terminal region 32b and a second terminal region 32c on its both sides with the housing opening 32a therebetween. The first terminal region 32b is where first terminals are disposed and the second terminal region 32c is where second terminals are disposed.

A plurality of external connection terminals 33 to 36 protrude from opposite sides of the terminal package 30 to the external space. The plurality of external connection terminals 33 to 35 are firmly joined in a row on one long side of the lower body part 32. Each external connection terminal 33 has one end protruding from the one long side of the lower body part 32 to the external space and the other end exposed in the first terminal region 32b. In addition, the external connection terminals 34 and 35 are also firmly joined in the same row as the external connection terminals 33 on the one long side of the lower body part 32. The external connection terminals 34 and 35 are disposed such that their one ends protrude from the one long side of the lower body part 32 to the external space and their other ends are exposed in the first terminal region 32b and extend along the one long end of the lower body part 32. The control ICs 37 are respectively disposed at three points on the external connection terminal 35 in the first terminal region 32b with a solder (not illustrated). In addition, the plurality of external connection terminals 36 are integrally formed in a row on the other long side opposite to the one long side of the lower body part 32. The external connection terminals 36 have their one ends protruding from the other long side of the lower body part 32 to the external space and their other ends exposed in the second terminal region 32c.

The upper frame part 31 is plate-shaped and has a ring shape corresponding to the outer periphery of the lower body part 32. The upper frame part 31 is integrally formed with the outer periphery of the front surface of the lower body part 32. In a top view, the outer periphery of the upper frame part 31 may be the same as that of the lower body part 32. In addition, in the top view, the inner periphery of the upper frame part 31 may be larger than that of the lower body part 32. Each of the external connection terminals 33 to 36 may partly be interposed between the rear surface of the upper frame part 31 and the first or second terminal region 32b or 32c of the lower body part 32. Furthermore, the external connection terminals 33 to 36 may be exposed on the lower body part 32 on the inner peripheral side of the upper frame part 31.

The upper frame part 31 and lower body part 32 are both made of a thermosetting resin of the same type. This resin contains a thermosetting resin, such as a maleimide-modified epoxy resin, a maleimide-modified phenolic resin, or a maleimide resin, and a filler, which is added to the thermosetting resin. A specific example is an epoxy resin, and as a filler, silicon oxide, aluminum oxide, boron nitride, aluminum nitride, or another is added to the epoxy resin.

In the semiconductor unit 20 housed in this terminal package 30, the first semiconductor chips 21, second semiconductor chips 22, external connection terminals 33 to 36, and control ICs 37 are electrically connected to each other with wiring members, such as wires (no reference numeral given), as appropriate. In this connection, instead of wires, conductive wiring members such as ribbons or a lead frame may be used for the connection. By doing so, a desired circuit is configured in the semiconductor device 10. In addition, the semiconductor unit 20, wires, control ICs 37, and others housed in a space surrounded by the housing opening 32a of the lower body part 32 and the upper frame part 31 are sealed by the sealing member 38. The sealing member 38 contains a thermosetting resin, such as a maleimide-modified epoxy resin, a maleimide-modified phenolic resin, or a maleimide resin, and a filler, which is added to the thermosetting resin. A specific example is an epoxy resin, and as a filler, silicon oxide, aluminum oxide, boron nitride, aluminum nitride, or another is added to the epoxy resin. Alternatively, a silicone gel may be used as the sealing member 38. In this case, after the sealing by the sealing member 38, a package lid (not illustrated) is provided on the terminal package 30 to seal the terminal package 30.

Figure 3:
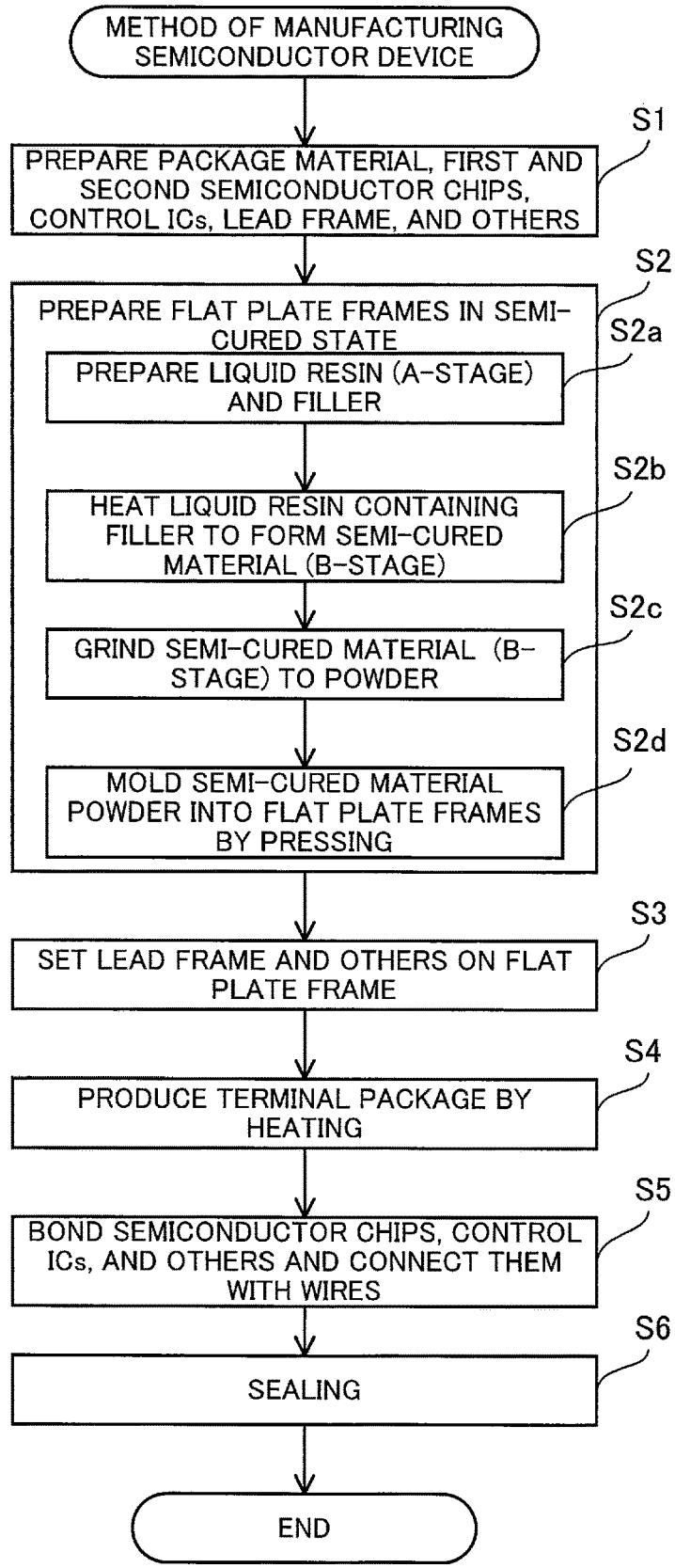
FIG. 3 is a view for explaining a method of manufacturing the semiconductor device according to the embodiment.
Figure 4:
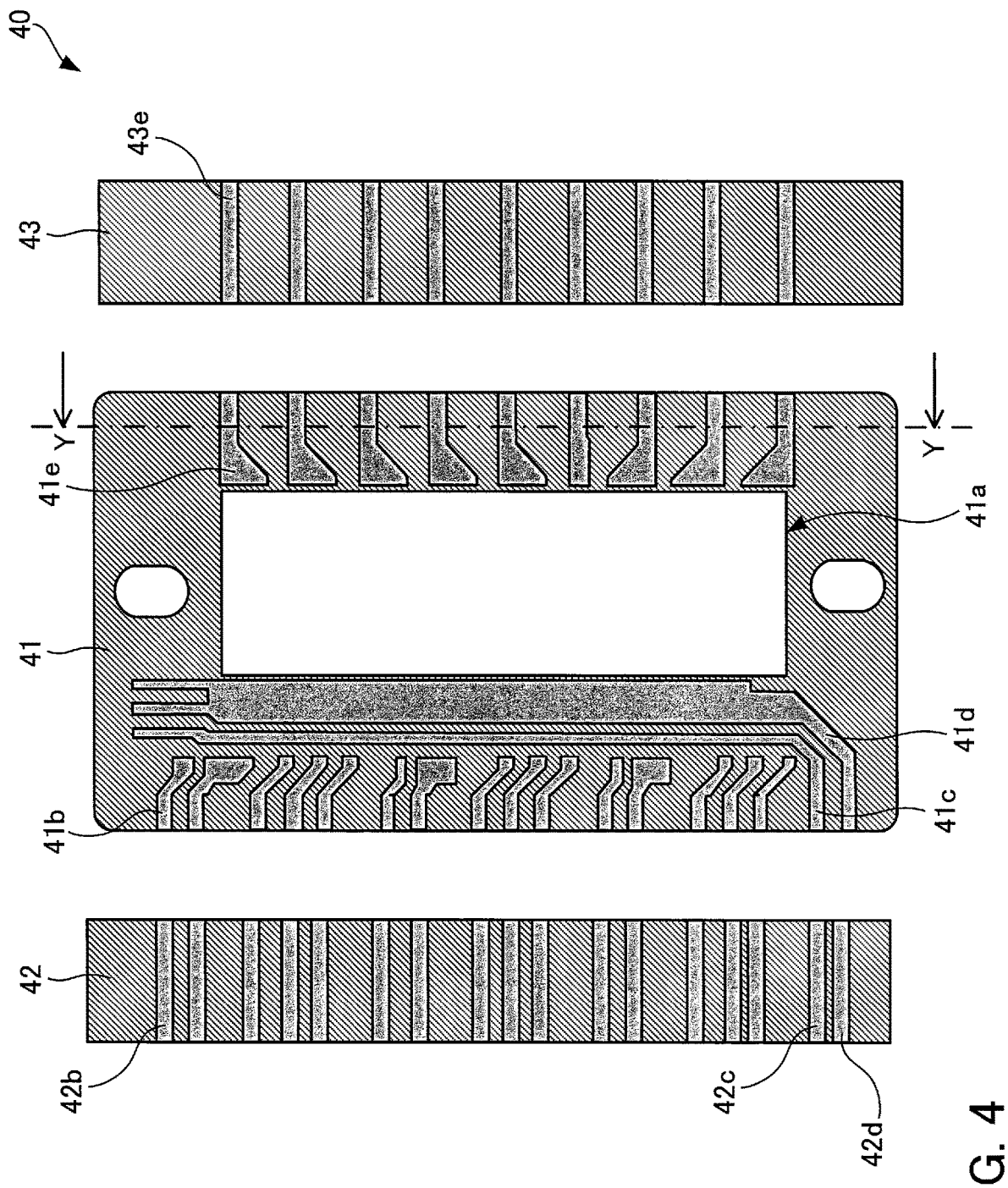
FIG. 4 is a plan view of a flat plate frame for a lower body part, to be used in manufacturing the semiconductor device according to the embodiment.
Figure 5:
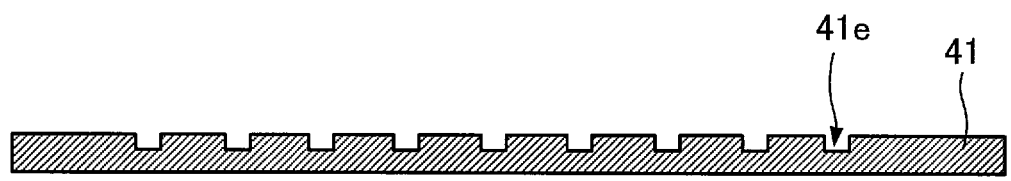
FIG. 5 is a cross-sectional view of the flat plate frame for the lower body part, to be used in manufacturing the semiconductor device according to the embodiment.
Figure 6:
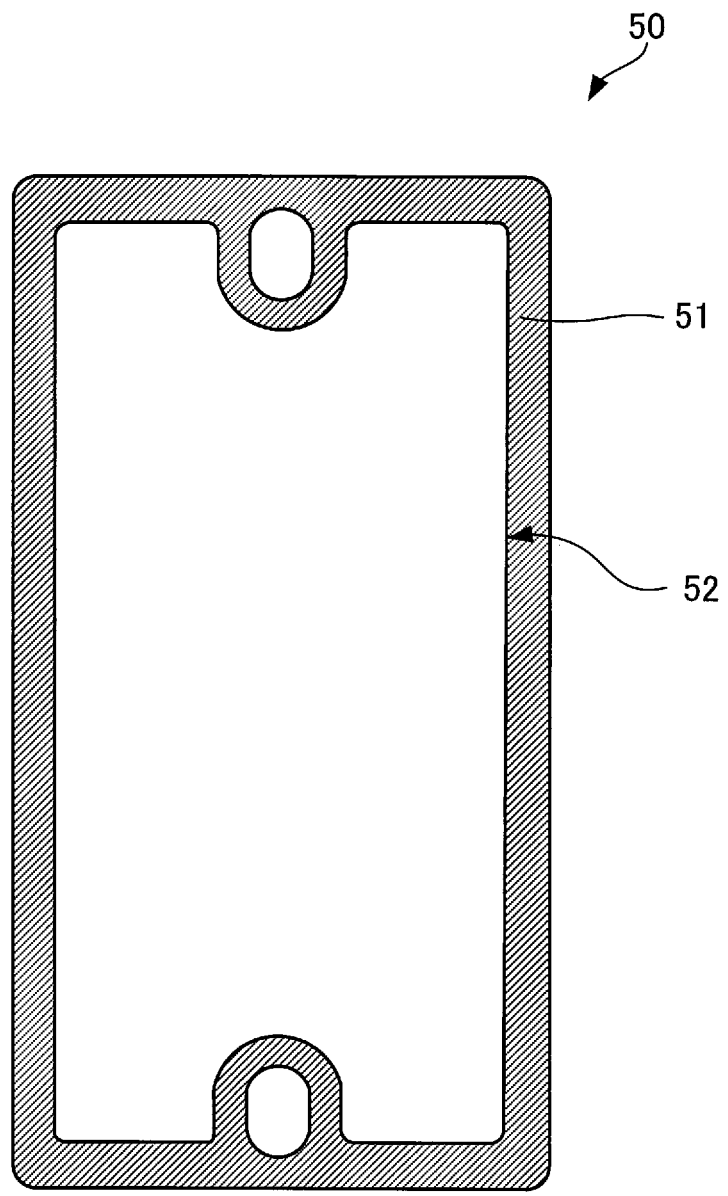
FIG. 6 is a plan view of a flat plate frame for an upper frame part, to be used in manufacturing the semiconductor device according to the embodiment.

The following describes a method of manufacturing the above semiconductor device 10 with reference to FIGS. 3 to 11. FIG. 3 is a view for explaining a method of manufacturing a semiconductor device according to the embodiment. FIG. 4 is a plan view of a flat plate frame for a lower body part, to be used in manufacturing the semiconductor device according to the embodiment. FIG. 5 is a cross-sectional view of the flat plate frame for the lower body part, to be used in manufacturing the semiconductor device according to the embodiment. In this connection, FIG. 5 is a cross-sectional view taken along the dot-dashed line Y-Y of FIG. 4. FIG. 6 is a plan view of a flat plate frame for an upper frame part, to be used in manufacturing the semiconductor device according to the embodiment.

Figure 7:
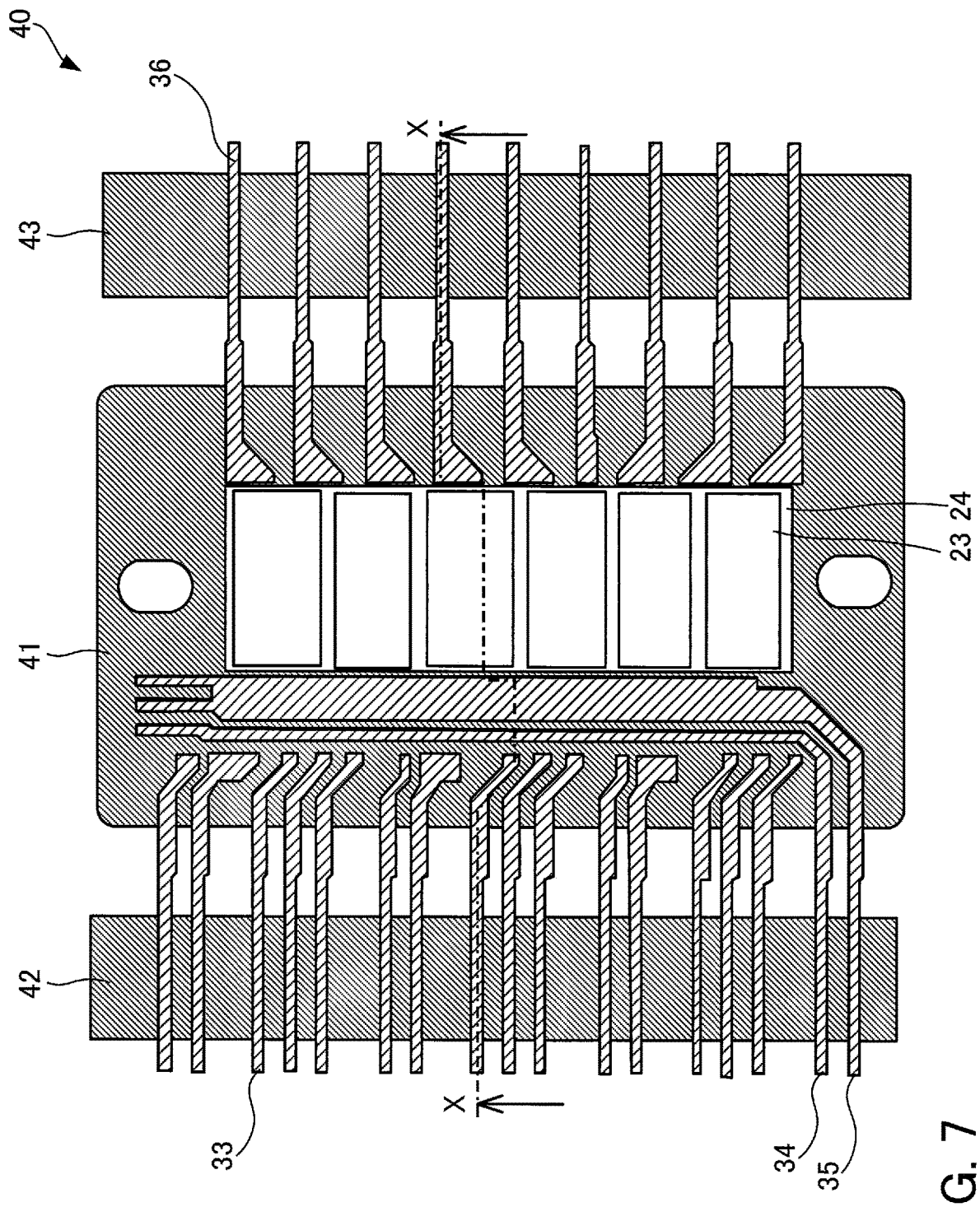
FIG. 7 is a view for explaining how to set external connection terminals and an insulating substrate on the flat plate frame for the lower body part in manufacturing the semiconductor device according to the embodiment (part 1)
Figure 8:
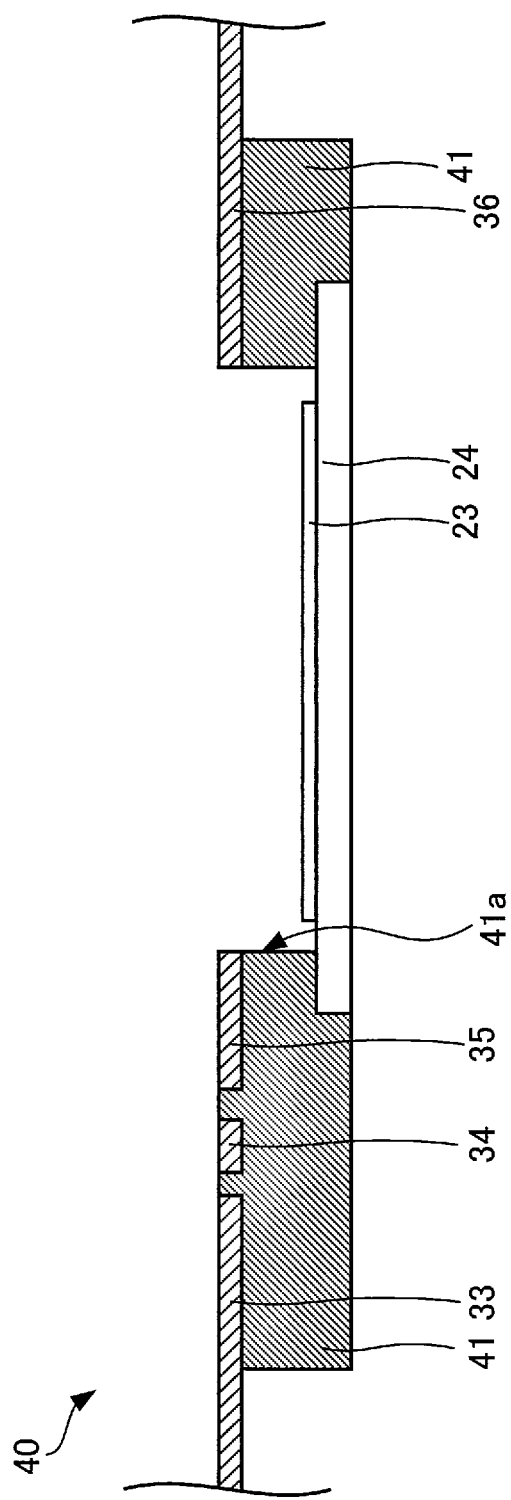
FIG. 8 is a view for explaining how to set the external connection terminals and insulating substrate on the flat plate frame for the lower body part in manufacturing the semiconductor device according to the embodiment (part 2)
Figure 9:
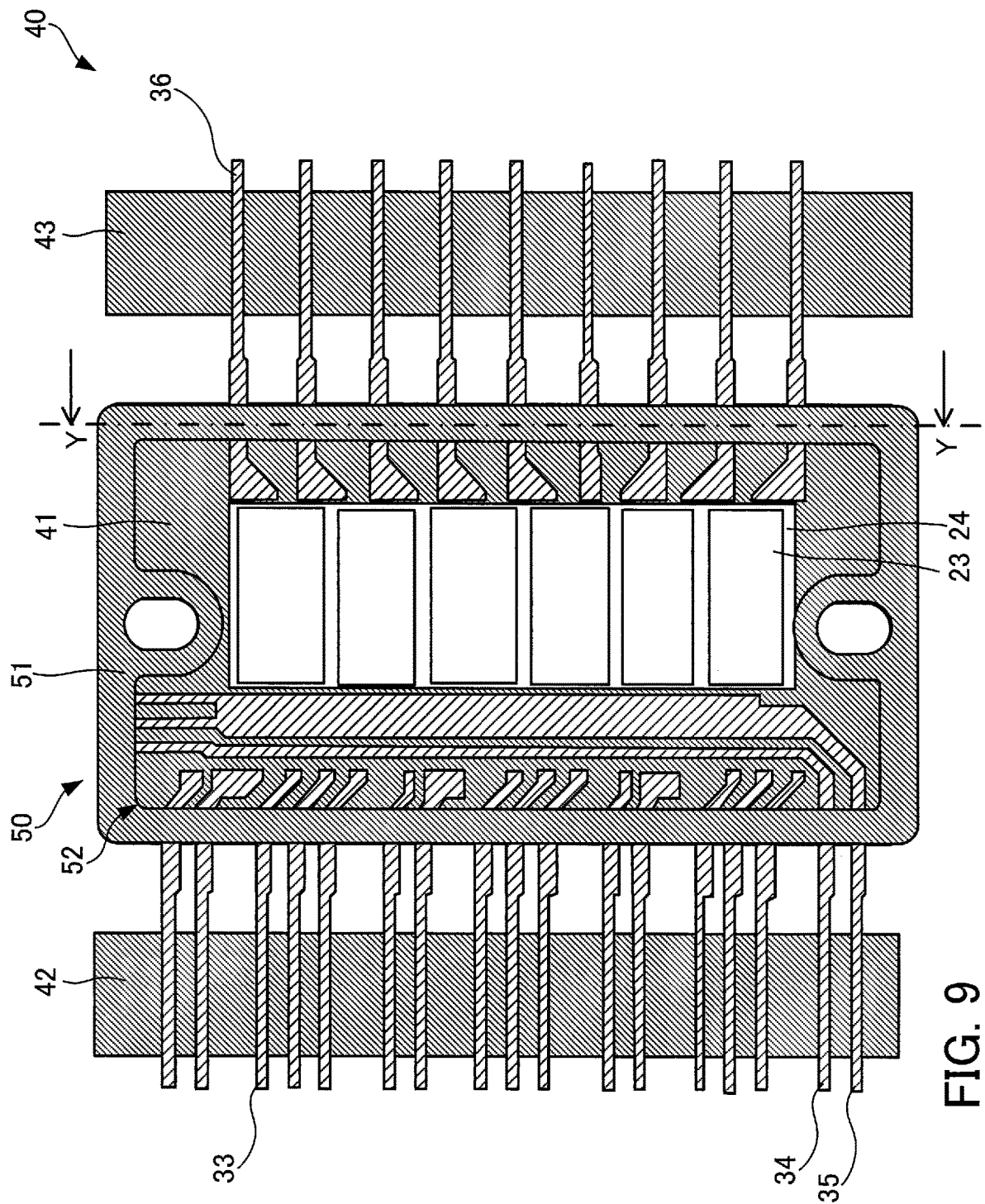
FIG. 9 is a view for explaining how to set the flat plate frame for the upper frame part on the flat plate frame for the lower body part in manufacturing the semiconductor device according to the embodiment (part 1)
Figure 10:
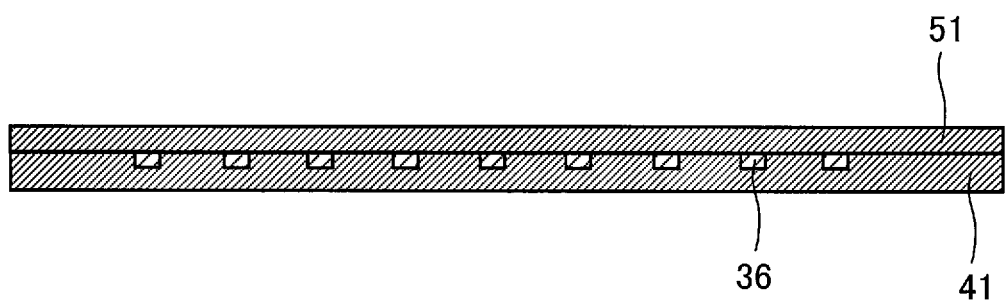
FIG. 10 is a view for explaining how to set the flat plate frame for the upper frame part on the flat plate frame for the lower body part in manufacturing the semiconductor device according to the embodiment (part 2)
Figure 11:
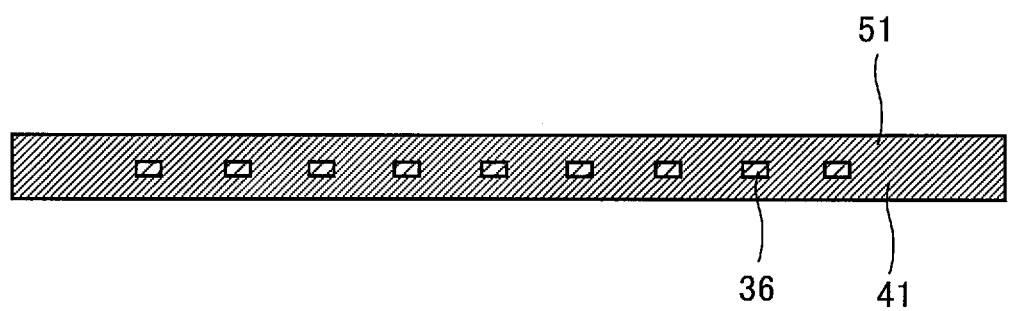
FIG. 11 is a view for explaining production of a terminal package by heating in manufacturing the semiconductor device according to the embodiment.

FIGS. 7 and 8 are views for explaining how to set external connection terminals and an insulating substrate on the flat plate frame for the lower body part in manufacturing the semiconductor device according to the embodiment. In this connection, FIG. 8 is a cross-sectional view taken along the dot-dashed line X-X of FIG. 7. FIGS. 9 and 10 are views for explaining how to set the flat plate frame for the upper frame part on the flat plate frame for the lower body part in manufacturing the semiconductor device according to the embodiment. In this connection, FIG. 10 is a cross-sectional view taken along the dot-dashed line Y-Y of FIG. 9. FIG. 11 is a view for explaining production of a terminal package by heating in manufacturing the semiconductor device according to the embodiment. In this connection, FIG. 11 is a cross-sectional view taken along the dot-dashed line Y-Y of the terminal package 30 of FIG. 1.

First, excepting for the terminal package 30, the components of the semiconductor device 10 are prepared, including a package material, the first semiconductor chips 21, the second semiconductor chips 22, the control ICs 37, a lead frame (not illustrated) where the external connection terminals 33 to 36 are arranged, the insulating substrate 24, and others (step S1). Then, flat plate frames in a semi-cured state are prepared (step S2). As illustrated in FIG. 4, a flat plate frame 40 is flat plate-shaped in a semi-cured state (B-stage), and has a body part 41 (first semi-cured member) and semi-cured terminal supporting parts 42 and 43 provided with some space from the body part 41. The body part 41 has an opening 41a and terminal patterns 41b, 41c, 41d, and 41e formed on its front surface. For example, the terminal patterns 41e are grooves formed on the front surface of the body part 41, as illustrated in FIG. 5. Similarly, grooves are formed on the front surface of the body part 41 as the other terminal patterns 41b, 41c, and 41d. With respect to each semi-cured terminal supporting part 42 and 43, grooves are formed on its front surface as terminal supporting patterns 42b, 42c, 42d, and 43e in the same way. In this connection, the terminal patterns 41b, 41c, and 41d of the body part 41 correspond to the terminal supporting patterns 42b, 42c, and 42d of the semi-cured terminal supporting part 42. The terminal patterns 41e of the body part 41 correspond to the terminal supporting patterns 43e of the semi-cured terminal supporting part 43. In addition, a flat plate frame 50 as illustrated in FIG. 6 is prepared. The flat plate frame 50 is flat plate-shaped in a semi-cured state (B-stage) and has a ring frame part 51 (second semi-cured member) defining an opening 52.

The following describes in detail how to prepare the flat plate frames 40 and 50 in a semi-cured state at step S2. First, a liquid resin (A-stage) that is a thermosetting resin and a filler to be mixed with the liquid resin are prepared (step S2a). The resin to be used here may be a phenolic resin, an epoxy resin, a melamine resin, or the like. The filler may be a silica filler or the like as a release agent. The silica filler as the filler is able to maintain high flame retardancy, without being mixed with halogen-based, antimony-based, or metal hydroxide-based flame retardant, or the like. Then, the filler is mixed with the liquid resin in an amount of 90% or more based on the amount of the liquid resin. The liquid resin containing the filler is heated and semi-cured, thereby forming a semi-cured material (B-stage) (step S2b). The heating time and warming time are properly set based on takt time and depends on the catalyst type of the resin. For example, the heating temperature ranges between 100° C. and 200° C., inclusive. Then, the semi-cured material is ground to powder (step S2c). After that, a prescribed mold is filled with the semi-cured material powder, and then the semi-cured material powder is pressed and then is removed from the mold. In the above manner, the flat plate frame 40 and the flat plate frame 50 are molded (step S2d). Here, the flat plate frame 40 has the opening 41a of FIG. 4 formed therein and has the terminal patterns 41b to 41e transferred thereon, whereas the flat plate frame 50 has the opening 52 formed therein. As described above, the flat plate frames 40 and 50 are prepared. In this connection, steps S1 and S2 need to be completed before step S3, and steps S1 and S2 may be executed in reverse order or simultaneously.

Then, a lead frame (external connection terminals 33 to 36) is set on the flat plate frame 40, and the flat plate frame 50 is set on the outer periphery of the front surface of the body part 41 having the lead frame set thereon (step S3). More specifically, the lead frame with the external connection terminals 33 to 36 is set on the flat plate frame 40 such that the external connection terminals 33 to 36 fit into the terminal patterns 41b to 41e of the body part 41 and the terminal supporting patterns 42b to 42d and 43e of the semi-cured terminal supporting parts 42 and 43. Unneeded parts are removed from the lead frame. In addition, the insulating substrate 24 having the circuit patterns 23 formed thereon is attached to the opening 41a of the flat plate frame 40 from its rear surface. By doing so, the external connection terminals 33 to 35 are set on the body part 41 and semi-cured terminal supporting part 42 in the flat plate frame 40, and the external connection terminals 36 are set on the body part 41 and semi-cured terminal supporting part 43, as illustrated in FIGS. 7 and 8. In this connection, FIG. 8 does not illustrate the semi-cured terminal supporting parts 42 and 43 on which the external connection terminals 33 to 36 are set. In addition, the circuit patterns 23 are exposed in the opening 41a of the body part 41. In this connection, in the flat plate frame 40 set as described above, the front surface of the body part 41 is flush with the front surfaces of the external connection terminals 33 to 36. In addition, the rear surface of the body part 41 is flush with the rear surface of the insulating substrate 24. The flat plate frame 50 is set on the front surface of the body part 41 of the flat plate frame 40 having the external connection terminals 33 to 36 and insulating substrate 24 set thereon in the above manner, as illustrated in FIG. 9. Thereby, portions of the external connection terminals 33 to 36 lying on the body part 41 and the circuit patterns 23 are surrounded by the flat plate frame 50. In addition, as illustrated in FIG. 10, the external connection terminals 36 set on the terminal patterns 41e of the body part 41 of the flat plate frame 40 are held from both sides by the body part 41 and the frame part 51 of the flat plate frame 50. Similarly, the other external connection terminals 33 to 35 are held from both sides by the body part 41 of the flat plate frame 40 and the frame part 51 of the flat plate frame 50.

Then, the flat plate frames 40 and 50 having the external connection terminals 33 to 36 and insulating substrate 24 set thereto at step S3 is heated, so that the terminal package 30 is produced (step S4). At this time, the heating temperature ranges between 120° C. and 180° C., inclusive. This accelerates the curing, so that the external connection terminals 33 to 36 and insulating substrate 24 are firmly joined to the flat plate frame 40. Furthermore, as illustrated in FIG. 11, the flat plate frame (frame part 51) is integrated with the flat plate frame (body part 41), and the external connection terminals 33 to 36 are firmly joined to the flat plate frame 50. By accelerating the curing, the terminal package 30 is produced. The terminal package 30 has the upper frame part 31 and the lower body part 32 and also has the external connection terminals 33 to 36 and insulating substrate 24. At step S4, the flat plate frame 50 (frame part 51) and the flat plate frame 40 (body part 41) may completely be cured. Alternatively, after-cure may be performed at a step after step S4 so as to completely cure the flat plate frame 50 (frame part 51) and the flat plate frame 40 (body part 41). Note that the embodiment has described the case of producing the terminal package 30 that is formed of the upper frame part 31 and the lower body part 32. Alternatively, the terminal package 30 may be formed of only the lower body part 32, depending on desired design requirements. In this case, a process of setting the flat plate frame 50 on the flat plate frame 40 is omitted at step S3.

The above terminal package 30 is produced, not by insert molding. That is to say, a precise and large-scale apparatus including a mold for use in the insert molding is not needed for producing the terminal package 30. As compared with the insert molding, the terminal package 30 is simply produced and needs low production cost. In addition, the terminal package 30 is produced using components cured from semi-cured material powder by pressing. Therefore, bubbles are rarely generated, although bubbles are generated in the insert molding. This enables the terminal package 30 to improve its insulating property and moisture resistance reliability. In addition, the insert molding causes junctures (welds) of molten resin when the molten resin is injected in a mold. The welds generated in a terminal package in the insert molding may be fragile portions of the terminal package. By contrast, the terminal package 30 is produced, not by the insert molding. Therefore, no welds are generated in the terminal package 30. This improves the strength and thus reliability. In addition, the external connection terminals 33 to 36 and insulating substrate 24 are firmly joined together to the terminal package 30. Unlike the case of employing the insert molding to mold a terminal package, the present method eliminates the need of using an adhesive agent to bond the insulating substrate 24, and therefore this bonding process does not need to be performed. The terminal package 30 is made of a thermosetting resin with high adhesion property to metal. Therefore, a gap is minimized or almost eliminated between the terminal package 30 and the external connection terminals 33 to 36, and thus moisture is prevented from entering between the terminal package 30 and the external connection terminals 33 to 36. This leads to an improvement in the moisture resistance reliability of the terminal package 30.

Next, the first semiconductor chips 21, second semiconductor chips 22, and control ICs 37 are bonded and wiring is performed in the terminal package 30 (step S5). More specifically, the first semiconductor chips 21 and second semiconductor chips 22 are soldered to the circuit patterns 23 in the terminal package 30, and the control ICs 37 are soldered to the external connection terminal 35 (this process is referred to as sub-step S5a (not illustrated)). The first semiconductor chip 21 and the second semiconductor chip 22 on each circuit pattern 23 are electrically connected to each other with a wire (this process is referred to as sub-step S5b (not illustrated)). Then, the external connection terminals 33 to 36, first semiconductor chips 21, second semiconductor chips 22, and circuit patterns 23 are electrically connected to one another with wires, as appropriate (this process is referred to as sub-step S5c (not illustrated)). Note that the external connection terminals 33 to 36 are reliably and firmly joined to the terminal package 30, as described above. Therefore, in bonding wires to the external connection terminals 33 to 36, the external connection terminals 33 to 36 are not displaced, so that the wires are reliably bonded to the external connection terminals 33 to 36.

In this connection, sub-steps S5a and S5b may be executed immediately before step S4. Alternatively, sub-step S5a may be executed after step S3 so that the heating for producing the terminal package 30 at step S4 also serves as the soldering. In addition, sub-step S5b may be executed at any time after the first semiconductor chips 21 and second semiconductor chips 22 are soldered to the circuit patterns 23. In this connection, sub-step S5c needs to be executed after steps S1 to S4 and sub-steps S5a and S5b.

Next, the first semiconductor chips 21, second semiconductor chips 22, circuit patterns 23, wires, and others inside the upper frame part 31 and lower body part 32 of the terminal package 30 are sealed with the sealing member 38 (step S6). In the manner described as above, the semiconductor device 10 of FIGS. 1 and 2 is manufactured. In this connection, FIGS. 1 and 2 do not illustrate parts corresponding to the semi-cured terminal supporting parts 42 and 43 in the flat plate frame 40 having the external connection terminals 33 to 36 set thereon.

In the above-described method of manufacturing the semiconductor device 10, the insulating substrate 24 having the circuit patterns 23 formed thereon and the external connection terminals 33 to 36 are prepared. Then, the flat plate frame 40 is formed, which is flat plate-shaped, has the opening 41a penetrating its front and rear surfaces and the groove terminal patterns 41b to 41e formed on its front surface, and contains a semi-cured thermosetting resin. After that, the insulating substrate 24 is disposed on the rear surface of the flat plate frame 40 so as to cover the opening 41a of the flat plate frame 40, and the external connection terminals 33 to 36 are disposed on the terminal patterns 41b to 41e, and then heating is performed. As a result, the terminal package 30 to which the insulating substrate 24 and external connection terminals 33 to 36 are firmly joined is produced using the flat plate frame 40.

The external connection terminals 33 to 36 included in thus produced terminal package 30 are reliably and firmly joined to the terminal package 30. Therefore, in bonding wires to the external connection terminals 33 to 36, the external connection terminals 33 to 36 are not displaced, so that the wires are reliably bonded to the external connection terminals 33 to 36. In addition, the terminal package 30 is produced, not by insert molding. That is, a precise and large-scale apparatus including a mold for use in the insert molding is not needed. As compared with the insert molding, the terminal package 30 is simply produced and needs low production cost. In addition, the insert molding causes junctures (welds) of molten resin when the molten resin is injected in a mold. The welds generated in a terminal package in the insert molding may be fragile portions of the terminal package. By contrast, the terminal package 30 is produced, not by the insert molding. Therefore, no welds are generated in the terminal package 30. This improves the strength and thus reliability. In addition, the external connection terminals 33 to 36 and insulating substrate 24 are firmly joined together to the terminal package 30. Unlike the case of employing the insert molding to mold a terminal package, the present method eliminates the need of using an adhesive agent to bond the insulating substrate 24, and therefore this bonding process does not need to be performed. The terminal package 30 is made of a thermosetting resin with high adhesion property to metal. Therefore, a gap is minimized or almost eliminated between the terminal package 30 and the external connection terminals 33 to 36, and thus moisture is prevented from entering between the terminal package 30 and the external connection terminals 33 to 36. This leads to an improvement in the moisture resistance reliability of the terminal package 30.

According to the embodiment, the external connection terminals are reliably and firmly joined to the terminal package, to thereby prevent a decrease in the reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method of manufacturing a semiconductor device, the method comprising:
preparing a substrate made of an insulating material and an external connection terminal;
forming a first semi-cured member that contains a thermosetting resin and is in a semi-cured state, the first semi-cured member having a planar shape, including an opening penetrating from a front surface to a rear surface of the first semi-cured member, and having a groove pattern formed at the front surface thereof; and
disposing the substrate on the rear surface of the first semi-cured member so as to cover the opening of the first semi-cured member, disposing the external connection terminal on the groove pattern, and producing a package including a first flat plate frame to which the substrate and the external connection terminal are bonded, using the first semi-cured member.

2. The method of manufacturing the semiconductor device according to claim 1, wherein the forming of the first semi-cured member includes mixing an inorganic filler powder with a liquid thermosetting resin to obtain a mixture, heating the mixture to convert the mixture to a semi-cured material having a semi-cured state, and grinding the semi-cured material into powder.

3. The method of manufacturing the semiconductor device according to claim 2, wherein the forming of the first semi-cured member further includes filling a first mold with a ground semi-cured powder, and pressing the ground semi-cured powder in the first mold to form the first semi-cured member.

4. The method of manufacturing the semiconductor device according to claim 1, wherein the producing of the package includes curing, by heating, the first semi-cured member on which the substrate and the external connection terminal are disposed, to convert the first semi-cured member to the first flat plate frame.

5. The method of manufacturing the semiconductor device according to claim 4, wherein the heating is performed at a temperature in a range of 120° C. to 180° C.

6. The method of manufacturing the semiconductor device according to claim 1, wherein:
the forming of the first semi-cured member includes forming, together with the first semi-cured member, a semi-cured terminal supporting member that contains a thermosetting resin in a semi-cured state, the semi-cured terminal supporting member having a planar shape and having a groove supporting pattern formed on a front surface thereof; and
the producing of the package includes disposing, on the groove supporting pattern of the semi-cured terminal supporting member, a part of the external connection terminal that protrudes toward an exterior from the first semi-cured member.

7. The method of manufacturing the semiconductor device according to claim 6, wherein the producing of the package further includes curing together, by heating, the semi-cured terminal supporting member and the first semi-cured member.

8. The method of manufacturing the semiconductor device according to claim 1, further comprising sealing a space of the package in which the substrate is disposed with a sealing member after the producing of the package.

9. The method of manufacturing the semiconductor device according to claim 1, wherein the external connection terminal is disposed on the groove pattern to be in direct contact with an inner surface of the groove pattern of the first semi-cure member.

10. A method of manufacturing the semiconductor device comprising:
preparing a substrate and an external connection terminal;
forming a first semi-cured member that contains a thermosetting resin and is in a semi-cured state, the first semi-cured member having a planar shape, including an opening penetrating from a front surface to a rear surface of the first semi-cured member, and having a groove pattern formed at the front surface thereof;
disposing the substrate on the rear surface of the first semi-cured member so as to cover the opening of the first semi-cured member, disposing the external connection terminal on the groove pattern, and producing a package including a first flat plate frame to which the substrate and the external connection terminal are bonded, using the first semi-cured member; and
forming a second semi-cured member that contains a semi-cured thermosetting resin in a semi-cured state, the second semi-cured member having a planar ring shape, and an outer periphery that corresponds to an outer periphery of the first semi-cured member, wherein
the forming of the first semi-cured member includes mixing an inorganic filler powder with a liquid thermosetting resin to obtain a mixture, heating the mixture to convert the mixture to a semi-cured material having a semi-cured state, and grinding the semi-cured material into powder, and
the producing of the package includes
disposing the second semi-cured member on the front surface of the first semi-cured member, thereby sandwiching the external connection terminal by the first and second semi-cured members, and
producing the package including a second flat plate frame integrally bonded to the first flat plate frame, using the second semi-cured member.

11. The method of manufacturing the semiconductor device according to claim 10, wherein the producing of the package further includes curing together, by heating, the first semi-cured member and the second semi-cured member disposed on the front surface of the first semi-cured member, to respectively convert the first semi-cured member and the second semi-cured member to the first flat plate frame and the second flat plate frame.

12. The method of manufacturing the semiconductor device according to claim 11, wherein the forming of the second semi-cured member includes filling a second mold with a semi-cured powder and pressing the semi-cured powder in the second mold, to form the second semi-cured member.

13. The method of manufacturing the semiconductor device according to claim 10, wherein the second flat plate frame is made of a material that is the same as a material of the first flat plate frame.

14. A method of manufacturing a semiconductor device, the method comprising:
preparing a substrate and an external connection terminal;
forming a first semi-cured member that contains a thermosetting resin and is in a semi-cured state, the first semi-cured member having a planar shape, including an opening penetrating from a front surface to a rear surface of the first semi-cured member, and having a pattern formed at the front surface thereof, the pattern including a groove recessed from the front surface of the first semi-cured member toward the rear surface of the first semi-cured member without penetrating through the first semi-cured member; and
disposing the substrate on the rear surface of the first semi-cured member so as to cover the opening of the first semi-cured member, disposing the external connection terminal on the pattern of the first semi-cured member, and producing a package including a first flat plate frame to which the substrate and the external connection terminal are bonded, using the first semi-cured member.

15. The method of manufacturing the semiconductor device according to claim 14, wherein the disposing the external connection terminal on the pattern of the first semi-cured member includes disposing the external connection terminal on the first semi-cured member such that the external connection terminal contacts an inner surface of the groove of the pattern.

* * * * *